(12) United States Patent
Braune et al.

(10) Patent No.: US 7,045,956 B2
(45) Date of Patent: May 16, 2006

(54) LIGHT EMITTING DIODE WITH WAVELENGTH CONVERSION

(75) Inventors: Bert Braune, Wenzenbach (DE); Marcus Ruhnau, Teublitz (DE)

(73) Assignee: Osram Opto Semiconductors GmbH (DE)

( * ) Notice: Subject to any disclaimer, the term of this patent is extended or adjusted under 35 U.S.C. 154(b) by 9 days.

(21) Appl. No.: 10/429,916

(22) Filed: May 5, 2003

(65) Prior Publication Data

US 2004/0094757 A1 May 20, 2004

Related U.S. Application Data

(60) Provisional application No. 60/387,338, filed on Jun. 10, 2002.

(30) Foreign Application Priority Data

May 6, 2002 (DE) ................................. 102 20 137

(51) Int. Cl.
*H05B 33/00* (2006.01)

(52) U.S. Cl. .................................................. 313/512

(58) Field of Classification Search ................ 313/498, 313/501, 502, 503, 512; 250/459.1; 257/79, 257/89, 100
See application file for complete search history.

(56) References Cited

U.S. PATENT DOCUMENTS

| | | | | |
|---|---|---|---|---|
| 3,875,456 A * | 4/1975 | Kano et al. | .................. | 313/501 |
| 4,178,274 A | 12/1979 | Denk et al. | ................. | 260/31.8 |
| 4,365,052 A | 12/1982 | Reeh et al. | ................... | 528/92 |
| 4,481,422 A * | 11/1984 | deMarco et al. | ......... | 250/459.1 |
| 5,811,924 A * | 9/1998 | Okumura et al. | ........... | 313/487 |
| 6,066,861 A | 5/2000 | Höhn et al. | .................... | 257/99 |
| 6,552,487 B1 | 4/2003 | Ellens et al. | | |
| 6,614,170 B1 * | 9/2003 | Wang et al. | ................. | 313/498 |
| 6,642,652 B1 * | 11/2003 | Collins et al. | .............. | 313/512 |
| 6,650,044 B1 * | 11/2003 | Lowery | ....................... | 313/502 |
| 6,669,866 B1 | 12/2003 | Kummer et al. | | |
| 6,717,355 B1 * | 4/2004 | Takahashi et al. | .......... | 313/503 |
| 2001/0048966 A1 | 12/2001 | Trumble et al. | | |

FOREIGN PATENT DOCUMENTS

| | | | | |
|---|---|---|---|---|
| DE | 26 42 465 | 9/1976 | | |
| DE | 26 42 465 | 3/1978 | | |
| EP | 0 039 017 | 4/1981 | .................... | 59/42 |
| EP | 1 024 185 A2 | 8/2000 | ...................... | 11/2 |
| EP | 1 024 185 A3 | 9/2001 | ...................... | 11/2 |
| WO | WO 98/12757 | 3/1998 | | |
| WO | WO 01/08452 | 2/2001 | | |
| WO | WO 01/08453 | 2/2001 | | |
| WO | WO 01/51585 A1 | 7/2001 | ...................... | 11/2 |

OTHER PUBLICATIONS

Copy of International Search Report, PCT/DE03/01452.

* cited by examiner

*Primary Examiner*—Joseph Williams
(74) *Attorney, Agent, or Firm*—Fish & Richardson P.C.

(57) ABSTRACT

The invention relates to a wavelength-converting reaction resin compound into which a wavelength-converting luminescent material and a thixotroping agent are mixed, wherein the luminescent material contains inorganic luminescent particles. The thixotroping agent is present, at least in part, in the form of nanoparticles. Methods of producing the reaction resin compound and light-emitting diode elements having such reaction resin compounds are indicated.

21 Claims, 2 Drawing Sheets

LIGHT EMITTING DIODE WITH WAVELENGTH CONVERSION

CROSS-REFERENCE TO RELATED APPLICATIONS

This application claims the benefit of U.S. Provisional Application No. 60/387,338, filed Jun. 10, 2002.

FIELD OF THE INVENTION

The invention relates to a wavelength-converting reaction resin compound and a method of producing it and a light-emitting diode element having a reaction resin compound.

BACKGROUND OF THE INVENTION

A wavelength-converting reaction resin compound of the type initially referenced is known from WO 98/12757. A wavelength-converting reaction resin compound is described therein in which an inorganic luminescent pigment powder having grain sizes $\leq 20$ μm and a mean grain diameter $d_{50} \leq 5$ μm is dispersed in a transparent casting resin.

In the field of light-emitting diodes (LEDs), the use of conversion luminescent materials makes it possible to produce multicolored light by means of a single LED chip. In this process, at least part of the radiation emitted by an LED chip is absorbed by the conversion luminescent material, which then in turn emits radiation of a different wavelength than the absorbed radiation. This radiation emitted by the luminescent material, and radiation emitted by the LED chip and not absorbed by the luminescent material, together then produce the multicolored radiation.

In known light-emitting diode elements made with reaction resin compounds of the type initially referenced, luminescent materials having a density between 4 and 5 $g/cm^3$ are used. The luminescent powders used have luminescent particles whose mean diameter is generally less than 5 μm.

When larger luminescent particles are used in conventionally available reaction resin systems such as epoxy resin, they precipitate during the production process.

In particular during the phase of heating up a resin, shortly before the beginning of the hardening process, its viscosity drops far enough that luminescent particles are no longer held in suspension and precipitate out.

As proposed in WO 98/12757, by adding aerosil to the casting resin for luminescent particles having a mean grain diameter $d_{50} \leq 5$ μm, this sedimentation may be reduced sufficiently so that very good distribution of the luminescent particles in the casting resin may be achieved after the hardening process of the casting resin.

With this method of thixotroping by means of aerosil, it is also possible to use luminescent materials with larger particles if larger volumes of aerosil are added. But because adding conventional aerosil reduces the transparency of the resin material, for the conventional types the volume of such aerosil to be added is limited to such a degree that in the case of YAG:Ce luminescent material, for example, the limit of the mean particle diameter is approximately 5 μm.

SUMMARY OF THE INVENTION

The invention is based on the problem of developing a thixotroping of reaction resin compounds with which it is possible to prevent to a very great degree the sedimentation of luminescent particles having a mean particle diameter greater than 5 μm, preferably greater than 5 μm and less than or equal to 20 μm, while at the same time retaining sufficient transparency of the reaction resin compound.

In the case of the wavelength converting reaction resin compound according to the invention, at least part of the thixotroping material is present in the form of nanoparticles. Such nanoparticles are preferably particles having a mean particle diameter between 1 nm and 100 nm.

This permits inorganic luminescent particles having a mean particle diameter greater than 5 μm to be dispersed advantageously in the reaction resin, without the transparency of the reaction resin compound being degraded in an unacceptable manner by the thixotroping.

The inorganic luminescent particles can advantageously have a $d_{50}$ value, measured in Q3, which is between 10 μm inclusive and 20 μm inclusive.

It is preferable if the thixotroping agent contains nanoparticles having a $d_{50}$ value measured in Q3 between 1 nm inclusive and 25 nm inclusive. It is particularly preferable if the $d_{50}$ value is between 5 nm inclusive and 15 nm inclusive, especially between 9 nm inclusive and 12 nm inclusive.

As used herein, the "$d_{50}$ value measured in Q3" for a distribution of particles is the median particle diameter of a cumulative volume distribution. This means that 50% of the volume of particles have particles with a diameter greater than the $d_{50}$ value and 50% of the volume of particles have particles with a diameter less than the $d_{50}$ value.

It is preferable if the reaction resin compound has at least one material from the group consisting of epoxy resin, silicone resin and acrylic resin. These are advantageously the reaction resin compounds traditionally used in optoelectronics, for example for LED chips. Alternatively, other optically transparent reaction resin compounds may be used, for example heteropolymers such as cellulose derivatives, polycarbonates, polysulfones, polyimides, polyamides, etc., polyolefins (such as polyethylene), styrol polymerisates, polyurethanes, etc.

It is preferable if the thixotroping agent contains a colloidal $SiO_2$ solution. The following materials are also usable as thixotroping agents: titanium dioxide, zirconium oxide or $SiO_2$. Especially suitable here are pyrogenically produced oxides that also have a surface coating matched to the reaction resin. Examples in this regard are surface-treated aerosils ($SiO_2$), such as those from the Degussa company, which correspond in terms of their properties to colloidal $SiO_2$. Coated aerosil powders have the advantage that, while they have a thixotropic effect similar to that of the colloidal $SiO_2$ solution, they can be added to the reaction resin as powder, whereas in the case of a mixture of reaction resin and colloidal solution, it is preferable if the solvent is extracted before the hardening. Other nanoparticles, whether produced in a colloid chemistry process, made by a progenic process in a gas phase reaction or produced in a colloidal-solution-gel procedure are also conceivable. In principle, all methods of production that are able to produce particles of nanometer size are suitable for the nanoparticles.

It is especially preferable if the reaction resin compound is suitable for enclosing a radiation-emitting body, especially a semiconductor chip, whose radiation emission spectrum includes at least radiation from the ultraviolet, blue or green spectral regions. In this connection, it is advantageous for it to be pervious to at least part of the radiation emitted by the body, and for the luminescent material to contain, preferably, at least luminescent particles from the group of garnets doped with rare earths, thiogallates doped with rare earths, aluminates doped with rare earths or orthosilicates doped with rare earths.

It is especially preferable if the luminescent material contains luminescent particles from the group of garnets having the general formula $A_3B_5O_{12}$:M, where component A contains at least one element from the group consisting of Y, Gd, Tb, La, Lu, Sc and Sm, component B contains at least one element from the group consisting of Al, Ga and In, and component M contains at least one element from the group consisting of Ce, Pr, Eu, Cr, Nd and Er. For light-emitting diode elements that emit white light, having a light-emitting diode chip that emits blue light, whose emission spectrum preferably exhibits a maximum intensity at a wavelength between 420 nm inclusive and 475 nm inclusive, a luminescent material of $Y_3Al_5O_{12}$:Ce and/or $(Y, Gd, Tb)_3(Al, Ga)_5O_{12}$:Ce is especially well suited as the luminescent material.

Other suitable groups of luminescent material are the nitride silicates and the oxynitrides, but also the thiogallates doped with rare earths, such as $CaGa_2S_4$:$Ce^{3+}$ and $SrGa_2S_4$:$Ce^{3+}$, the aluminates doped with rare earths, such as $YAlO_3$:$Ce^{3+}$, $YGaO_3$:$Ce^{3+}$ and $Y(Al,Ga)O_3$:$Ce^{3+}$, and the orthosilicates doped with rare earths, such as $Y_2SiO_5$:$Ce^{3+}$. These and other suitable luminescent materials are described, for example, in the publications WO 98/12757, WO 01/08452 and WO 01/08453, which are hereby incorporated by reference.

Nanoparticles allow significantly stronger thixotroping of the reaction resin than is possible with the conventional addition of a conventional aerosol, without at the same time reducing the transparency to an unacceptable degree.

The use of nanoparticles makes thixotroping of reaction resins possible to the point where particles of a luminescent material such as YAG-Ce having a mean particle size of 10–20 μm may be used with essentially no sedimentation in the manufacture of an LED, at the same time retaining acceptable transparency.

Among the resulting advantages are less complicated and hence less expensive methods of grinding the luminescent materials. The need for luminescent material is also reduced, because the efficiency of a luminescent material in the lower μm range increases as particle size increases.

When nanoparticles having a higher refractive index, such as $TiO_2$ or $ZrO_2$, are used, it is also possible to increase the overall refractive index of the reaction resin compound, which results in improved light decoupling from a light-emitting diode element.

In addition, it is possible to achieve advantageously a protective effect against blue light having wavelengths below 410 nm by adding nanoparticles of $TiO_2$ or $ZrO_2$ for example.

In an especially preferred embodiment of the reaction resin compound according to the invention, this material features epoxy resin and contains between 1 and 15% by weight of luminescent material, referenced to the A component of the epoxy resin, preferably colloidal $SiO_2$ nanoparticles in a concentration between 5 and 30% by weight. The mean diameter of the luminescent particles here is preferably greater than 5 μm and less than 20 μm, and is especially preferably between 10 μm and 20 μm. A mineral diffuser, processing aid, hydrophobing agent and/or bonding agent may also be added.

Suitable epoxy resins are described, for example, on pages 4 through 9 of German Unexamined Patent Application 26 42 465, especially examples 1 through 4, and on pages 2 through 5 of European Patent 0 039 017, especially examples 1 through 8, the disclosure content of which is hereby incorporated by reference.

$CaF_2$ may be used as a mineral diffuser for optimizing the luminance pattern of the element.

One example of a suitable processing aid is glycol ether. It improves the compatibility between epoxy resin and luminescent pigment powder, thus helping to stabilize the dispersion of luminescent pigment powder and epoxy resin. Surface modifiers based on silicon may also be used for this purpose.

The hydrophobing agent, for example liquid silicone wax, is also used to modify the surface of the pigment; in particular, the compatibility and wettability of the inorganic pigment surface is improved with the organic resin.

The bonding agent, for example functional alkoxysiloxane, improves the adhesion between the pigments and the epoxy resin in the hardened condition of the reaction resin compound. As a result, the boundary surface between the epoxy resin and the pigments does not tear off, for example under temperature fluctuations. Any gaps between the epoxy resin and the pigments would lead to losses of light in the element.

The epoxy resin, preferably having a reactive three-membered oxirane ring, preferably contains a monofunctional and/or a multifunctional epoxy resin system ($\geq 80\%$ by weight, for example bisphenol-A-diglycidyl ether), a reactive thinning agent ($\leq 10\%$ by weight, for example aromatic monoglycidyl ether), a multifunctional alcohol ($\leq 5\%$ by weight), a silicone-based degassing agent ($\leq 1\%$ by weight) and a decolorization component for adjusting the color index ($\leq 11\%$ by weight).

It is also advantageous if the preferably high-purity luminescent powder has an iron content of $\leq 5$ ppm. A high iron content leads to high light losses in the element. The luminescent powder is highly abrasive. The iron content of the reaction resin compound can thus increase considerably during its manufacture. Iron concentrations of less than 20 ppm in the reaction resin compound are advantageous.

One of the special advantages of the inorganic luminescent material YAG:Ce is that it involves non-soluble color pigments having a refractive index of approximately 1.84. As a result, in addition to the wavelength conversion, dispersion and scattering effects occur that result in a good mixture of blue diode radiation and yellow converter radiation.

To further reduce agglomeration, it is advantageous if the luminescent particles are given a silicone coating.

In a preferred method of producing a reaction resin compound according to the invention, the luminescent powder is tempered, for example, for approximately 10 hours at a temperature of $\geq 200°$ C. before being mixed with the reaction resin. This process can also reduce the tendency to agglomeration.

Alternatively or in addition, before being mixed with the reaction resin, the luminescent powder may be elutriated for that purpose with a higher boiling-point alcohol and then dried. Another option for reducing agglomeration is to add a hydrophobing silicone wax to the luminescent powder before mixing it with the reaction resin. Especially advantageous is surface stabilization of the phosphors by heating the pigments in the presence of glycol ethers, for example for 16 hours at $T \geq 60°$ C.

Reaction vessels, stirring and dispersion devices and rolling mills made of glass, corundum, carbide and nitride materials or of specially hardened types of steel are used to prevent interference from impurities caused by abrasion when dispersing the luminescent particles.

Agglomerate-free dispersions of luminescent materials are also obtained in ultrasonic processes or through the use of sieves and glass ceramic frits.

Especially suitable for producing multicolored light, in addition to the special luminescent materials already mentioned above, are the thiogallates doped with rare earths, such as $CaGa_2S_4:Ce^{3+}$ and $SrGa_2S_4:Ce^{3+}$. Also conceivable for this purpose is the use of aluminates doped with rare earths, such as $YAlO_3:Ce^{3+}$, $YGaO_3:Ce^{3+}$ and $Y(Al,Ga)O_3:Ce^{3+}$, and $M_2SiO_5:Ce^{3+}$ orthosilicates doped with rare earths (M: Sc, Y, La), such as $Y_2SiO_5:Ce^{3+}$ In all yttrium compounds, the yttrium can also be replaced in principle by scandium or lanthanum.

It is preferable if the reaction resin compound according to the invention is used in a radiation-emitting semiconductor body, especially one having an active semiconductor layer (or sequence of layers) made of GaN, $Ga_xIn_{1-x}N$, $Ga_xAl_{1-x}N$ and/or $Al_xGa_yIn_{1-x-y}N$ that during operation emits electromagnetic radiation from the ultraviolet, blue and/or green spectral region.

The luminescent particles in the reaction resin compound convert part of the radiation coming from this spectral region into radiation having a higher wavelength, in such a way that the semiconductor element emits mixed radiation, especially multicolored light, consisting of this radiation and radiation from the ultraviolet, blue and/or green spectral region.

This means, for example, that the luminescent particles selectively absorb part of the radiation emitted by the semiconductor body, and emit it in the longer-wave region. It is preferable if the radiation emitted by the semiconductor body has a relative intensity maximum at a wavelength of $\lambda \leq 520$ nm, preferably between 420 nm and 475 nm, and if the wavelength range selectively absorbed by the luminescent particles is outside this intensity maximum.

Several different types of luminescent particles that absorb and/or emit at various wavelengths may also be advantageously dispersed in the reaction resin compound. This is achieved, preferably, by using different doping levels in different host lattices, which makes it advantageously possible to produce diverse color mixtures and color temperatures of the light emitted by the element. This is of particular interest for full-color LEDs.

In a preferred use of the reaction resin compound according to the invention, a radiation-emitting semiconductor body (such as an LED chip) is at least partially enclosed by this resin. In this connection, it is preferable if the reaction resin compound is used at the same time as an enclosure (housing) for the part. The primary advantage of a semiconductor element according to this embodiment is that conventional production lines used for producing conventional light-emitting diodes (such as radial light-emitting diodes) can be used to produce it. Instead of the transparent plastic used by conventional light emitting diodes to enclose the part, the reaction resin compound can simply be used.

Using the reaction resin compound according to the invention, it is possible in a simple manner to create multicolored light, especially white light, using a single colored light source, especially a light-emitting diode having a semiconductor body that emits a single blue light. For example, to produce white light using a semiconductor body emitting a blue light, part of the radiation emitted by the semiconductor body is converted by inorganic luminescent particles from the blue spectral region to the yellow region, which is color-complementary to blue. The color temperature or hue of the white light can be varied by appropriately selecting the luminescent material, its particle size and its concentration. Moreover, mixtures of luminescent materials may be used, advantageously enabling the desired color of the emitted light to be regulated very exactly.

It is especially preferred if the reaction resin compound is used with a radiation-emitting semiconductor body where the spectrum of emitted radiation exhibits an intensity maximum at a wavelength between 420 nm and 460 μm, especially at approximately 430–440 nm (such as semiconductor bodies based on $Ga_xAl_{1-x}N$) or at approximately 450–475 nm (such as semiconductor bodies based on $Ga_xIn_{1-x}N$). Using such a semiconductor element, nearly all colors and mixed colors of the C.I.E. color table can be advantageously produced. However, in place of the radiation-emitting semiconductor body made of electroluminescent semiconductor material, a different electroluminescent material, such as polymer material, may be used.

The reaction resin compound is especially well suited for a light-emitting semiconductor element (such as a light-emitting diode) in which the electroluminescent semiconductor body is placed in a recess of a housing which may already be provided with a lead frame, and the recess is provided with the reaction resin compound. A semiconductor element of this sort can be produced in large quantities in conventional production lines. This merely requires adding the reaction resin compound to the recess of the housing after the semiconductor body has been installed.

A semiconductor element that emits white light can be advantageously produced, using the reaction resin compound according to the invention, by choosing the luminescent material so that blue radiation emitted by the semiconductor body is converted into complementary wavelength regions, especially blue and yellow, or into additive color triads, such as blue, green and red. in this process, the yellow and/or the green and red light is created by means of the luminescent materials. The color (hue on the CIE color table) of the white light thus created can be varied by appropriately selecting the mixture and concentration of the luminescent material(s).

To improve the intermixing of the radiation emitted by an electroluminescent semiconductor body with the radiation converted by the luminescent material, and thus to improve the color homogeneity of the light emitted by the element, in an advantageous rendering of the reaction resin compound according to the invention, a colorant that luminesces in the blue region is also added, which reduces a so-called "directivity" characteristic of the radiation emitted by the semiconductor body. A directivity characteristic means that the radiation emitted by the semiconductor body has a preferred direction of radiation.

A semiconductor element according to the invention radiating white light, and having an electroluminescent semiconductor body that emits blue light, can be realized in an especially preferred way by adding the inorganic luminescent material YAG:Ce ($Y_3Al_5O_{12}:Ce^{3+}$) to the epoxy resin used for the reaction resin compound. A part of a blue radiation emitted by the semiconductor body is shifted by the inorganic luminescent material $Y_3Al_5O_{12}:Ce^{3+}$ into the yellow spectral region, and thus into a wavelength region that is color-complementary to the color blue.

In addition, light-scattering particles, so-called diffusers, may be added to the reaction resin compound. This permits further optimization of the color impression and of the radiation characteristics of the semiconductor element in an advantageous manner.

With the reaction resin compound according to the invention, it is also possible for ultraviolet radiation emitted by an electroluminescent semiconductor body along with the visible radiation to be converted advantageously to visible light. This significantly increases the brightness of the light emitted by the semiconductor body.

The crystal field splitting of the active transition metal centers in the host lattice determines the wavelength conversion of the primary radiation. The emission wavelengths can be shifted in different ways by replacing Y by Gd and/or Lu or Al by Ga in the $Y_3Al_5O_{12}$ garnet lattice, as they can also be shifted by the type of doping. By replacing $Ce^{3+}$ centers with $Eu^{3+}$ and/or $Cr^{3+}$, corresponding shifts can be created. Appropriate doping with $Nd^{3+}$ and $Er^{3+}$ even makes (R-emitting elements possible, because of the greater ion radii and thus reduced crystal field splitting.

BRIEF DESCRIPTION OF THE DRAWINGS

Additional characteristics, advantages and efficacies of the invention can also be seen from the exemplary embodiments described below in connection with FIGS. 1 through 6. The figures show the following.

In the various figures, like or equivalent parts are always designated with the same reference symbol.

DETAILED DESCRIPTION

Figure 1:
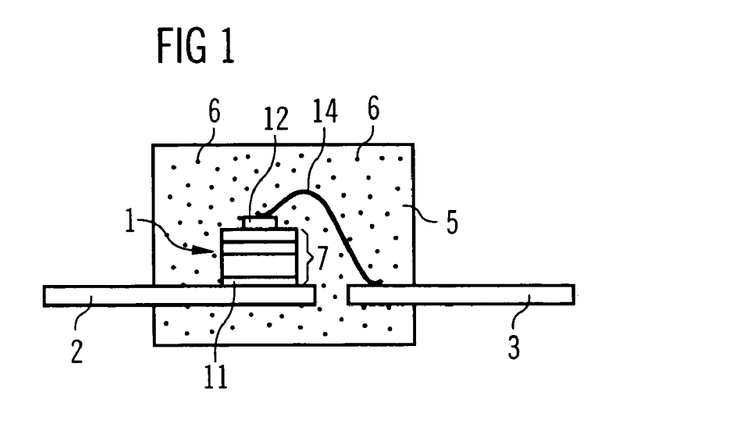
FIG. 1 shows a schematic sectional view of a first semiconductor element having a reaction resin compound according to the invention.

The light-emitting semiconductor element of FIG. 1 has a reaction resin compound according to the invention. Semiconductor body 1, an LED chip 7 having an active layer or sequence of layers (for example a multi-quantum well structure), having one or a plurality of layers based on $In_xGa_yAl_{1-x-y}N$ (where $0 \leq x \leq 1$, $0 \leq y \leq 1$ and $x+y<1$), in this case has its rear contact 11 attached to a first electrical connector 2 of a lead frame by means of an electrically conductive connecting element, for example a metallic solder, especially a soft solder, or an adhesive. The front contact 12 is connected to a second electrical connector 3 of the lead frame by means of a bond wire 14.

The free surfaces of semiconductor body 1 and portions of electrical connectors 2 and 3 are directly enclosed by a hardened, wavelength-converting reaction resin compound 5. Preferably, the latter has epoxy resin, luminescent powder of Ce-doped garnet material (for example YAG:Ce) having a concentration between 1% by weight inclusive and 15% by weight inclusive, colloidal $SiO_2$ nanoparticles having a particle size of 9 to 12 nm and a concentration between 5% and 30% by weight. In addition, diethylene glycol monomethyl ether$\leq$2% by weight and Tegoprene 6875–45$\leq$2% by weight may also be added. The specifications of percentage by weight refer to the A component of the epoxy resin. The luminescent powder contains luminescent particles 6 having a mean diameter for example between 10 µm and 20 µm.

Figure 2:
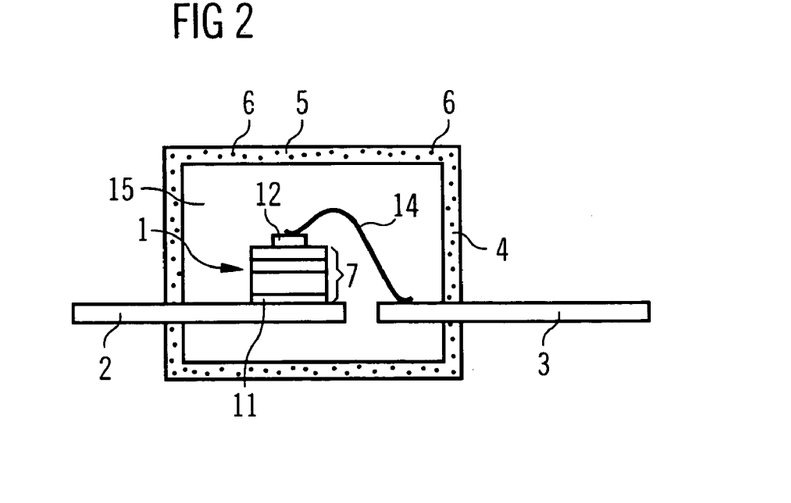
FIG. 2 shows a schematic sectional view of a second semiconductor element having a reaction resin compound according to the invention.

The exemplary embodiment of a semiconductor element according to the invention shown in FIG. 2 differs from FIG. 1 in that semiconductor body 1 and portions of electrical connections 2 and 3 are enclosed by a transparent or translucent covering 15 instead of a wavelength-converting reaction resin compound. This covering 15 does not cause any change in the wavelength of the radiation emitted by semiconductor body 1, and consists, for example, of an epoxide, silicone or acrylate resin typically used in light-emitting diode technology, or of some other suitable material pervious to radiation, such as inorganic glass.

A coating 4 of a wavelength-converting reaction resin compound is applied to this covering 15, and covers the entire surface of the covering 15, as shown in FIG. 2. It is also conceivable for the coating 4 to cover only part of this surface. The coating 4 consists, for example, of a reaction resin compound based on a transparent epoxy resin that has luminescent particles 6 mixed into it. An example here of a suitable reaction resin compound is the one described in connection with the first exemplary embodiment. Here too, YAG:Ce or YAG:Ce-based luminescent materials are preferably suitable as the luminescent material for a white-luminescent semiconductor element.

Figure 3:
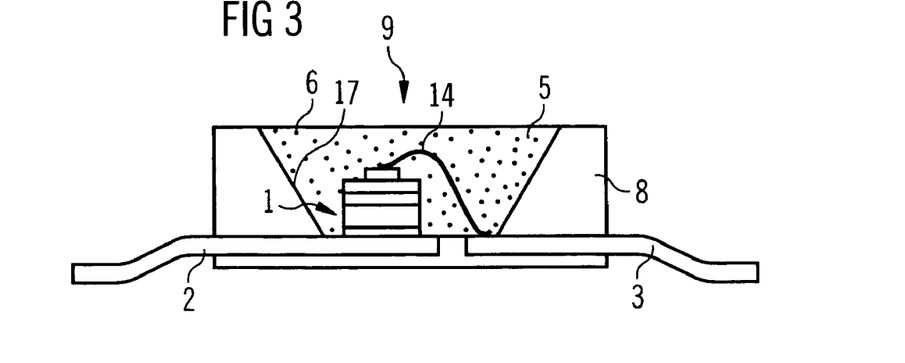
FIG. 3 shows a schematic sectional view of a third semiconductor element having a reaction resin compound according to the invention.

In the especially preferred element provided with the reaction resin compound according to the invention shown in FIG. 3, the first and second electrical connectors 2, 3 of a lead frame are incorporated into a basic housing 8 having a recess 9, prefabricated out of reflective plastic. "Prefabricated" means that basic housing 8 is already finish-formed on connectors 2, 3 by injection molding or transfer molding before semiconductor body 1 is mounted on connector 2. The basic housing 8 consists, for example, of a plastic filled with white, reflective filler, and the form of recess 9 is designed as a reflector 17 (possibly by suitably coating the inner walls of recess 9) for the radiation emitted during operation by the semiconductor body. Such basic housings 8 are used in particular for light-emitting diode elements that are surface-mountable on circuit boards. They are placed on a lead frame that has the electrical connectors 2, 3 before the semiconductor bodies are mounted, for example by injection molding.

Recess 9 is at least partially filled with a reaction resin compound 5. An example here of a suitable reaction resin compound is the one described in connection with the first exemplary embodiment.

Alternatively, the recess may be filled with a transparent or translucent compound that performs no wavelength conversion or only a first one, and to which a wavelength-converting coating corresponding to coating 4 of FIG. 3 is applied.

Figure 4:
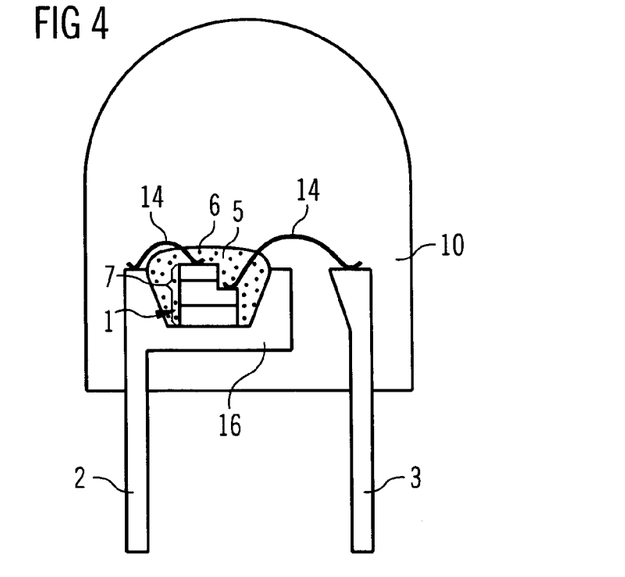
FIG. 4 shows a schematic sectional view of a fourth semiconductor element having a reaction resin compound according to the invention.

FIG. 4 shows a so-called radial diode. In this connection, the radiation-emitting semiconductor body 1 is attached in a part 16 of the first electrical connector 2 formed as a reflector, for example by soldering or gluing. Such housing designs are known in light-emitting diode technology, and therefore require no further explanation.

The free surfaces of semiconductor body 1 are immediately covered by a reaction resin compound 5 having luminescent particles 6, which in turn is enclosed by an additional transparent covering 10. An example of a suitable reaction resin compound here again is that described in conjunction with the first exemplary embodiment.

For the sake of completeness, it should be noted that, as with the element according to FIG. 1, a one-piece covering consisting of hardened reaction resin compound 5 having luminescent particles 6 may of course also be used for the design according to FIG. 4.

Figure 5:
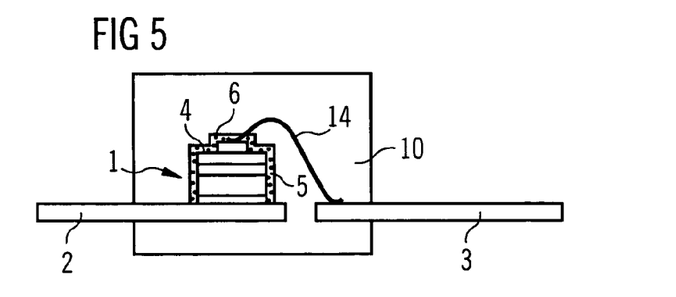
FIG. 5 shows a schematic sectional view of a fifth semiconductor element having a reaction resin compound according to the invention.

In the exemplary embodiment in FIG. 5, a coating 4 of a reaction resin compound according to the invention is applied directly to semiconductor body 1. This body, and portions of electrical connectors 2, 3, are enclosed by an additional transparent covering 10, which does not cause any change in the wavelength of the radiation passing through coating 4, and which is made, for example, of a transparent epoxy resin that is usable in light-emitting diode technology, or of glass. An example here again of a suitable reaction resin compound is the one described in connection with the first exemplary embodiment.

Such semiconductor bodies 1, provided with a conversion coating 4, may be prefabricated and optionally installed in all housing designs known from semiconductor technology (such as SMD housings or radial housings (see FIG. 4). Conversion coating 4 does not necessarily have to cover the entire free surface of semiconductor body 1, but may instead span only portions of the semiconductor body. Conversion coating 4 may, for example, be applied to semiconductor bodies already in the wafer composite before final separation of the wafer into a plurality of semiconductor bodies. Conversion coating 4 also preferably has a constant thickness.

Figure 6:
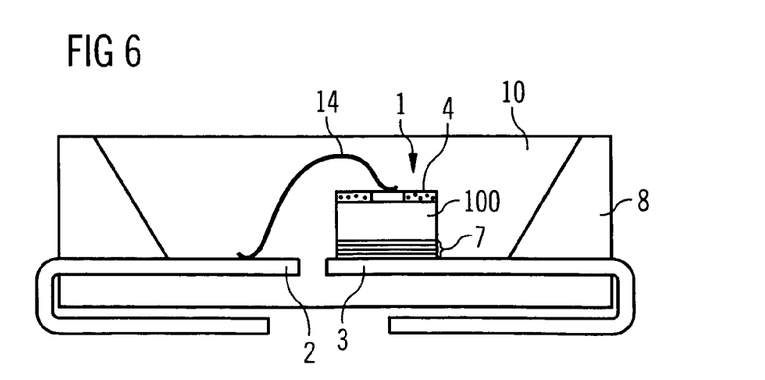
FIG. 6 shows a schematic sectional view of a sixth semiconductor element having a reaction resin compound according to the invention.

In the exemplary embodiment depicted in FIG. 6, a turned (i.e., flip-chip-mounted) LED chip 1 is attached to lead frame 2, 3 inside a housing base 8. It has a substrate 100 that is pervious to the radiation emitted by the active layer sequence 7, and which may be structured for better radiation decoupling (not shown). On the side of the substrate facing away from the active layer sequence 7, a conversion coating 4 of a reaction resin compound according to the invention is applied that essentially has the same thickness throughout. Contrary to what is shown in the figure, it may also be drawn over the lateral faces (flanks). This conversion coating has preferably been applied to the LED chip prior to its installation. After the chip is installed in the recess of the body of the housing base, the latter is preferably enclosed in another plastic compound.

In all of the elements described above, to optimize the color impression of the radiated light and to adjust the radiation characteristics of reaction resin compound 5, the transparent or translucent covering 15 and/or the additional transparent or translucent covering 10 may have light-scattering particles, advantageously so-called diffusers. Examples of such diffusers are mineral filling materials, especially $CaF_2$, $TiO_2$, $SiO_2$, $CaCO_3$ or $BaSO_4$ or even organic pigments. These materials can easily be added to reaction resins such as epoxy resins.

In all of the elements described above, the LED chip can be an LED chip that radiates blue light, whose emission spectrum has at least one local intensity maximum below a wavelength of 520 nm, preferably between 440 nm and 475 nm. Luminescent material 6 (for example YAG:Ce) converts part of the radiation of the LED chip to yellow light, so that the element emits white light overall.

Only part of the radiation emitted by the semiconductor body is converted to a longer wavelength region, so that white light is created as a mixed color. Alternatively, two luminescent materials may be used, one which produces red light and one green light, so as to produce the color white overall from three wavelength regions (the additive color triad of blue, green and red).

In the semiconductor elements according to the invention, the CIE hue of the mixed light can easily be changed through the choice of luminescent materials and/or by modifying the concentration(s) of luminescent material in the reaction resin compound.

In one method of producing the reaction resin compound, the thixotroping agent (the nanoparticles) is added to the reaction resin first, and the luminescent particles are added in afterward.

Using the reaction resin compound according to the invention, it is possible to advantageously lower the concentration of luminescent material in the reaction resin compound, compared to conventionally used casting compounds, while retaining the same performance (such as the same hue). The reason for this is the greater efficiency of larger luminescent particles.

Of course, the explanation of the invention based on the elements described above must not be seen as restricting the invention to those elements. Semiconductor bodies, such as light-emitting diode chips or laser diode chips, can also be understood as polymer LEDs that emit an appropriate radiation spectrum.

The invention claimed is:

1. A wavelength-converting reaction resin compound comprising a mixture of a wavelength-converting luminescent material and a thixotroping agent, wherein the luminescent material contains inorganic luminescent particles,
    wherein at least part of the thixotroping agent is present in the form of nanoparticles having a $d_{50}$ value, measured in Q3, that is greater than or equal to 5 nm and less than or equal to 15 nm.

2. The reaction resin compound according to claim 1, wherein the inorganic luminescent particles have a $d_{50}$ value, measured in Q3, that is greater than 5 μm and less than or equal to 25 μm.

3. The reaction resin compound according to claim 1,
    wherein the inorganic luminescent particles have a $d_{50}$ value, measured in Q3, that is greater than or equal to 10 μm and less than or equal to 20 μm.

4. The reaction resin compound according to claim 1,
    wherein the nanoparticles of the thixotroping agent have a $d_{50}$ value, measured in Q3, that is greater than or equal to 9 nm and less than or equal to 12 nm.

5. The reaction resin compound according to claim 1,
    further comprising at least one material of the group consisting of epoxy resin, silicone resin and acrylic resin.

6. The reaction resin compound according to claim 1, wherein the thixotroping agent has a colloidal $SiO_2$ solution.

7. The reaction resin compound according to claim 1 for enclosing a radiation-emitting body, whose emission radiation spectrum contains at least radiation from the ultraviolet, blue or green spectral region, which is pervious to at least part of the radiation emitted by the body,
    wherein the luminescent material contains at least luminescent particles from the group of garnets doped with rare earths, thiogallates doped with rare earths, aluminates doped with rare earths or orthosilicates doped with rare earths.

8. The reaction resin compound according to claim 7, wherein the radiation-emitting body is a semiconductor chip.

9. The reaction resin compound according to claim 1 for enclosing a radiation-emitting body, whose emission radiation spectrum contains at least radiation from the ultraviolet, blue or green spectral region, which is pervious to at least part of the radiation emitted by the body,
    wherein the luminescent material contains at least luminescent particles from the group of garnets having the general formula $A_3B_5O_{12}$:M, where the component A contains at least one element from the group consisting of Y, Gd, Th, La, Lu, Sc and Sm, the component B contains at least one element from the group consisting of Al, Ga and In, and the component M contains at least one element from the group consisting of Ce, Pr, Eu, Cr, Nd and Er.

10. The reaction resin compound according to claim 9, wherein the radiation-emitting body is a semiconductor chip.

11. A light-radiating optical element comprising a wavelength-converting reaction resin compound according to claim 1 and a semiconductor body that emits electromagnetic radiation during operation of the optical element,
wherein the semiconductor body has a sequence of semiconductor layers that is suitable for emitting electromagnetic radiation from the ultraviolet, blue and/or green spectral region during operation of the semiconductor element, the luminescent pigments convert part of the radiation coming from this spectral region into radiation having a higher wavelength in such a way that the semiconductor element emits mixed radiation, comprising the radiation having the higher wavelength and the remaining radiation from the ultraviolet, blue and/or green spectral region.

12. A light-radiating optical element according to claim 11,
wherein the reaction resin compound encloses at least part of the semiconductor body.

13. A light-radiating semiconductor element according to claim 11, further comprising a non-light-transparent basic housing,
wherein the semiconductor body is positioned in a recess of the non-light-transparent basic housing, and wherein the recess is at least partially filled with the reaction resin compound.

14. The light-radiating optical element according to claim 11, wherein the mixed radiation is multicolored light.

15. A light-radiating semiconductor body having a wavelength-converting reaction resin compound according to claim 1,
wherein at least part of the surface of the light-radiating semiconductor body is coated with a conversion coating made of the reaction resin compound, which coating has essentially the same thickness throughout.

16. The reaction resin compound according to claim 1, wherein the thixotroping agent contains at least one material of the group consisting of colloidal $SiO_2$-solution-gel, titanium dioxide, zirconium oxide, and $SiO_2$.

17. The reaction resin compound according to claim 1, wherein the thixotroping agent contains at least a pyrogenically produced oxide.

18. The reaction resin compound according to claim 1, wherein the thixotroping agent contains nanoparticles, which are produced in a colloid chemistry process, a pyrogenic process in a gas phase reaction or in a colloidal-solution-gel procedure.

19. The reaction resin compound according to claim 1, wherein the nanoparticles have a surface coating matched to the reaction resin to stabilize a dispersion of the wavelength-converting luminescent material in the reaction resin compound.

20. The reaction resin compound according to claim 1 for enclosing a radiation-emitting body, whose emission radiation spectrum contains at least radiation from the ultraviolet, blue or green spectral region, which is pervious to at least part of the radiation emitted by the body, wherein the luminescent material contains at least luminescent particles from the group of garnets having the general formula $A_3B_5O_{12}$:M, where the component A contains at least one element from the group consisting of Y, Gd, Tb, La, Lu, and Sm, the component B contains at least one element from the group consisting of Al, Ga and In, and the component M contains at least one element from the group consisting of Ce, Pr, Eu, Cr, Nd and Er.

21. A wavelength-converting reaction resin compound comprising a mixture of a wavelength-converting luminescent material and a thixotroping agent, wherein the luminescent material contains inorganic luminescent particles having a $d_{50}$ value, measured in Q3, that is greater than or equal to 10 µm and less than or equal to 20 µm, and wherein at least part of the thixotroping agent is present in the form of nanoparticles.

* * * * *

UNITED STATES PATENT AND TRADEMARK OFFICE
CERTIFICATE OF CORRECTION

PATENT NO. : 7,045,956 B2 Page 1 of 1
APPLICATION NO. : 10/429916
DATED : May 16, 2006
INVENTOR(S) : Bert Braune and Marcus Ruhnau It is certified that error appears in the above-identified patent and that said Letters Patent is hereby corrected as shown below:

Column 4
Line 30, replace "11%" with --1%--

Column 6
Line 7, replace "460 µm" with --460 nm--

Column 11
Line 3, replace "Th" with --Tb--

Signed and Sealed this

Third Day of July, 2007

JON W. DUDAS
*Director of the United States Patent and Trademark Office*

UNITED STATES PATENT AND TRADEMARK OFFICE
CERTIFICATE OF CORRECTION

PATENT NO.         : 7,045,956 B2                                     Page 1 of 1
APPLICATION NO. : 10/429916
DATED              : May 16, 2006
INVENTOR(S)        : Bert Braune and Marcus Ruhnau It is certified that error appears in the above-identified patent and that said Letters Patent is hereby corrected as shown below:

Column 4
Line 30, replace "11%" with --1%--

Column 6
Line 7, replace "460 µm" with --460 nm--

Column 11
Line 3, replace "Th" with --Tb--

Signed and Sealed this

Seventeenth Day of July, 2007

JON W. DUDAS
*Director of the United States Patent and Trademark Office*